United States Patent [19]

Herrmann et al.

[11] Patent Number: 5,422,486
[45] Date of Patent: Jun. 6, 1995

[54] SCANNING ELECTRON BEAM DEVICE

[75] Inventors: Karl H. Herrmann, Tubingen; Steffen Beck, Heimstetten; Hans P. Feuerbaum, Heimstetten; Jurgen Frosien, Heimstetten; Andreas Benez, Sindelfingen; Stefan Lanio; Gerold Schonecker, both of Munich, all of Germany

[73] Assignee: ICT Integrated Circuit Testing Gesellschaft, Fur Halbleiterpruftechnik MbH, Germany

[21] Appl. No.: 58,959

[22] Filed: May 7, 1993

[30] Foreign Application Priority Data

May 20, 1992 [DE] Germany .................. 42 16 730.2

[51] Int. Cl.⁶ ............................................. G01N 23/00
[52] U.S. Cl. ................................ 250/396 R; 250/310
[58] Field of Search ............ 250/396 R, 396 ML, 397, 250/310

[56] References Cited

U.S. PATENT DOCUMENTS

| | | | |
|---|---|---|---|
| 4,658,136 | 4/1987 | Ohtaka et al. | 250/310 |
| 4,683,376 | 7/1987 | Feuerbaum | 250/310 |
| 4,823,005 | 4/1989 | Garth | 250/310 |

OTHER PUBLICATIONS

Septieme Congres International de Microscopie Electronique, Grenoble (1970), pp. 205–206.
J. Vac. Sci. Technol. B9(6), Nov./Dec. 1991 pp. 3010–3014.

*Primary Examiner*—Paul M. Dzierzynski
*Assistant Examiner*—Kiet T. Nguyen
*Attorney, Agent, or Firm*—Learman & McCulloch

[57] ABSTRACT

The invention relates to a scanning electron beam device in which at least one electrostatic reflector is provided for reflection of a secondary electron beam emitted by the primary electron beam on the object. This reflector is preferably located outside the beam path of the primary electron beam, and at least one electron-optical element which effects a preliminary deflection of the secondary electron beam by a small angle with respect to the beam path of the primary electron beam is provided between the object and the reflector. Such an arrangement makes it possible with comparatively low technical expenditure to reflect the secondary electron beam by a relatively large angle with respect to the unaffected primary electron beam which travels on a straight axis.

7 Claims, 11 Drawing Sheets

SCANNING ELECTRON BEAM DEVICE

BACKGROUND OF THE INVENTION

The invention relates to a scanning electron beam device, particularly an electron beam tester or a scanning electron microscope, according to the preamble to claim 1.

A scanning electron microscope according to the generic concept of claim 1 is known for example from the document "Septième Congrès International de Microscopie Electronique, Grantable (1970)", pages 205 to 206.

In this the primary electron beam passes through a deflecting bridge which is formed by four magnetic prisms and by means of which the secondary electron beam is simultaneously deflected and separated from the primary electron beam to such an extent that it can be detected by a detector. A principal disadvantage of this construction is the multiple deflection of the primary electron beam which is necessary. It requires a high technical expenditure if on the one hand disturbing effects on the primary electron beam are to be avoided and on the other hand a great deflection of the secondary electron beam which is favourable for the installation of the detector is to be achieved.

A scanning electron microscope which is known from J. Vac. Sci. Technol. B 9(6), Nov/Dec 1991, pages 3010 to 3014 has similar disadvantages. In this case the deflection of the secondary electron beam emitted by the primary electron beam on the object is carried out by a Wien filter. However, without high technical expenditure and without negative expansions on the primary electron beam, only small angles of deflection can be achieved for the secondary electron beam with such an arrangement.

The object of the invention, therefore, is to construct a scanning electron beam device according to the preamble to claim 1 in such a way that the deflection of the secondary electron beam by a large angle can be achieved in a particularly simple manner.

SUMMARY OF THE INVENTION

This object is achieved according to the invention by the characterising feature of claim 1. Advantageous embodiments of the invention are the subject matter of the subordinate claims.

According to the invention the arrangements for reflection of the secondary electron beam contain at least one electrostatic reflector which is arranged in such a way that it picks up and reflects at least a substantial part of the secondary electron beam.

In this case it is particularly advantageous that on the one hand the straight axis of the primary electron beam is retained but on the other hand the reflection of the secondary electron beam by a large angle and thus a favourable installation of the arrangements (spectrometer or detector) for detecting the reflected secondary electron beam is made possible by means of the electrostatic reflector.

In a particularly advantageous embodiment of the scanning electron beam device the reflector is arranged outside the beam path of the primary electron beam, and between the object and the reflector at least one electron-optical element is provided which effects a preliminary deflection of the secondary electron beam by a small angle with respect to the beam path of the primary electron beam.

A one- or two-stage Wien filter can advantageously be used for this preliminary deflection of the secondary electron beam, as will be explained below in greater detail with the aid of examples.

A particularly important field of application for the invention is in scanning electron beam devices in which the primary electron beam is accelerated to an energy which is higher than the final energy with which it strikes the specimen. In such scanning electron beam devices arrangements are provided by means of which the primary electron beam is retarded to its final energy before it strikes the specimen, in which case the secondary electron beam is simultaneously drawn off from the object by these arrangements and accelerated to a high energy.

As a result of the separation of the primary and secondary electron beams according to the invention—preferably by an electron-optical preliminary deflection of the secondary electron beam and subsequent reflection by means of an electrostatic reflector—on the one hand the primary electron beam can be maintained at a high energy until it is directly in front of the object (in order thus to minimise the electron-electron interaction), and on the other hand detecting the reflected secondary electron beam can be achieved without the efficiency of the optical arrangements for the primary electron beam being impaired.

In a preferred embodiment of the invention the secondary electron beam is restricted not at all or only slightly by the scanning of the primary electron beam. This is achieved in that the objective lens which serves for focussing the primary electron beam onto the object and the deflection system which is essentially arranged in front of the object—viewed in the direction of movement of the primary electron beam—for deflection of the primary electron beam are of such dimensions that when the deflected primary electron beam is focussed by the objective lens it is simultaneously rotated by about 90° with respect to the direction of deflection so that the secondary electron beam which is equally rotated by about 90° reaches the deflection system at an angle which corresponds to the negative angle of deflection of the primary electron beam. Thus in this way the secondary electron beam leaves the deflection system substantially axially and—independently of the scanning deflection of the primary electron beam—always enters almost axially into the arrangements according to the invention for deflection of the secondary electron beam.

BRIEF DESCRIPTION OF THE DRAWINGS

Some embodiments of the invention are illustrated in the drawings, in which:

FIG. 4 shows a schematic representation of an electrostatic reflector with an aperture for the primary electron beam to pass through;

DESCRIPTION OF THE PREFERRED EMBODIMENTS

Figure 1:
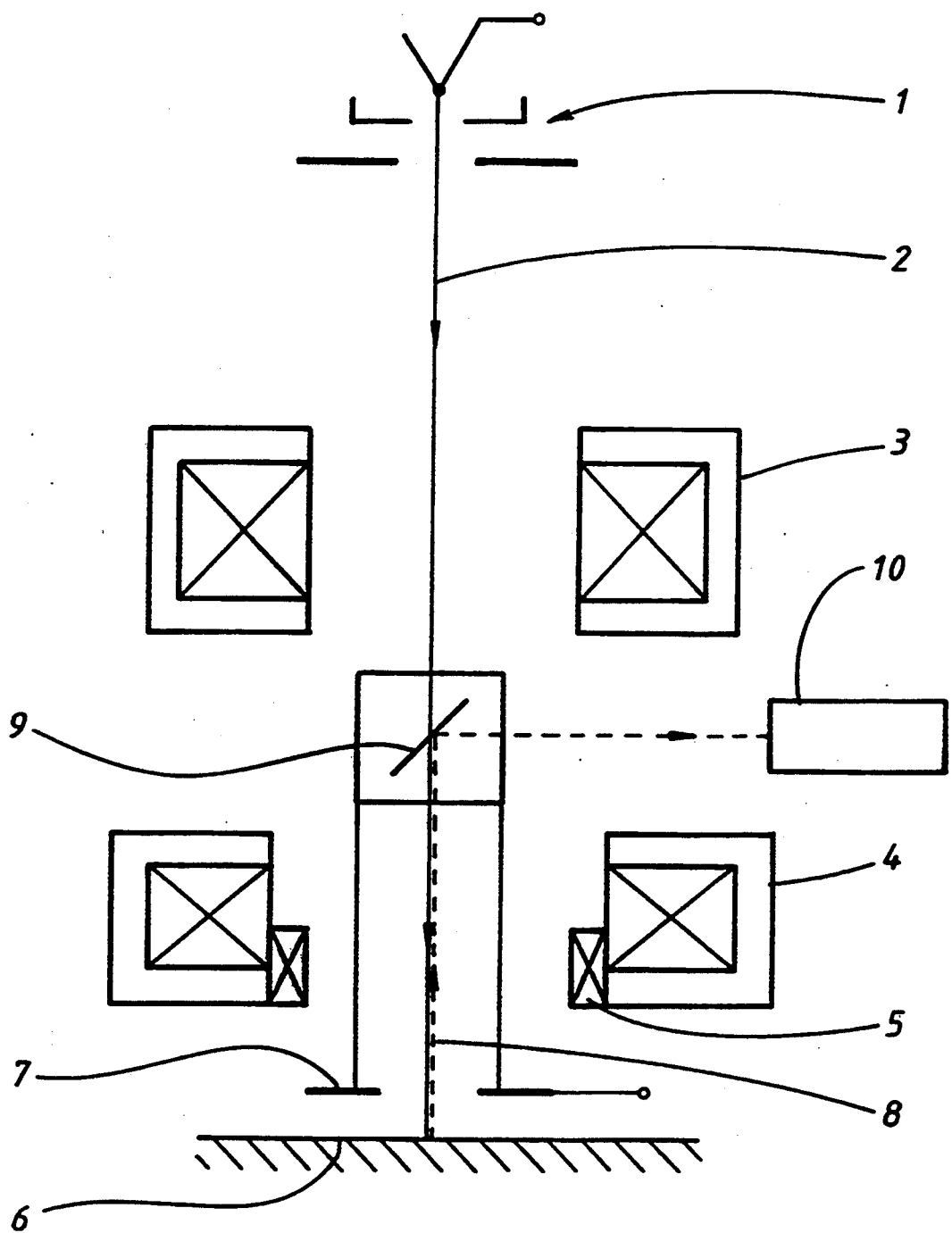
FIG. 1 shows a schematic representation of a scanning electron microscope according to the invention.

The scanning electron beam microscope according to the invention which is illustrated quite schematically in FIG. 1 contains an electron source 1 for producing a primary electron beam 2. This can be a thermionic electron source, for example with a tungsten or $LaB_6$ cathode, a thermionic field emission cathode or a cold field emission cathode.

The scanning electron microscope according to FIG. 1 also contains a condenser lens 3 which can be of one-stage construction as a single lens or can also be constructed as a multi-stage lens system. An objective lens 4 is also provided, as well as a raster deflection system 5 which can be of one- or two-stage construction.

Adjusting deflector elements, stigmators and diaphragms are not shown in FIG. 1 for the sake of clarity.

The secondary electrons emitted by the primary electron beam 2 on a specimen which forms the object 6 are drawn off by an extraction electrode 7. The extraction voltage of this electrode is typically some tens to some hundreds of volts.

An electrostatic reflector 9 which reflects the secondary electron beam 8 and delivers it to a detector 10 is located in the beam path of the secondary electron beam.

The details of the reflection of the secondary electron beam 8 will be explained further with the aid of FIGS. 4 to 15.

Figure 2:
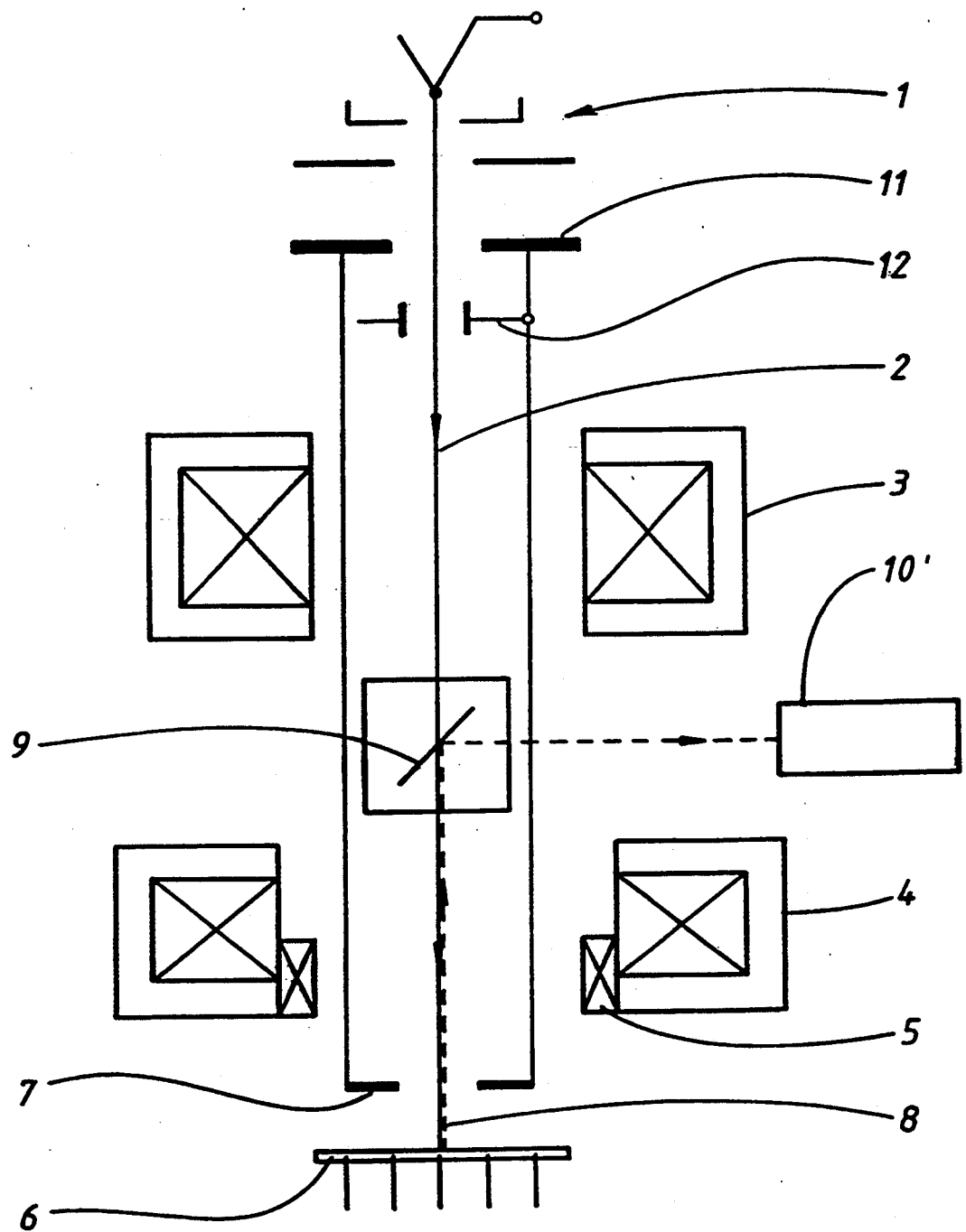
FIG. 2 shows a schematic representation of an electron beam tester according to the invention.

FIG. 2 shows an electron beam tester according to the invention. In this case the same reference numerals have been used for the same components as in FIG. 1.

Here the primary electron beam 2 first of all undergoes intermediate acceleration by means of an accelerating electrode 11 to a high energy. Since the extraction electrode 7 is conductively connected to the accelerating electrode 11, the suction voltage of the extraction electrode 7 corresponds to the intermediate acceleration voltage of the accelerating electrode 11.

The object 6 is formed by an integrated circuit which is supplied with voltage in the usual way. The secondary electron beam 8 which is reflected by the reflector 9 is delivered to a spectrometer 10'. The blanker of the electron beam tester according to FIG. 2 is designated by 12. However, a pulsed cathode, for example a pulsed photocathode, can be used instead of the blanker.

Figure 3:
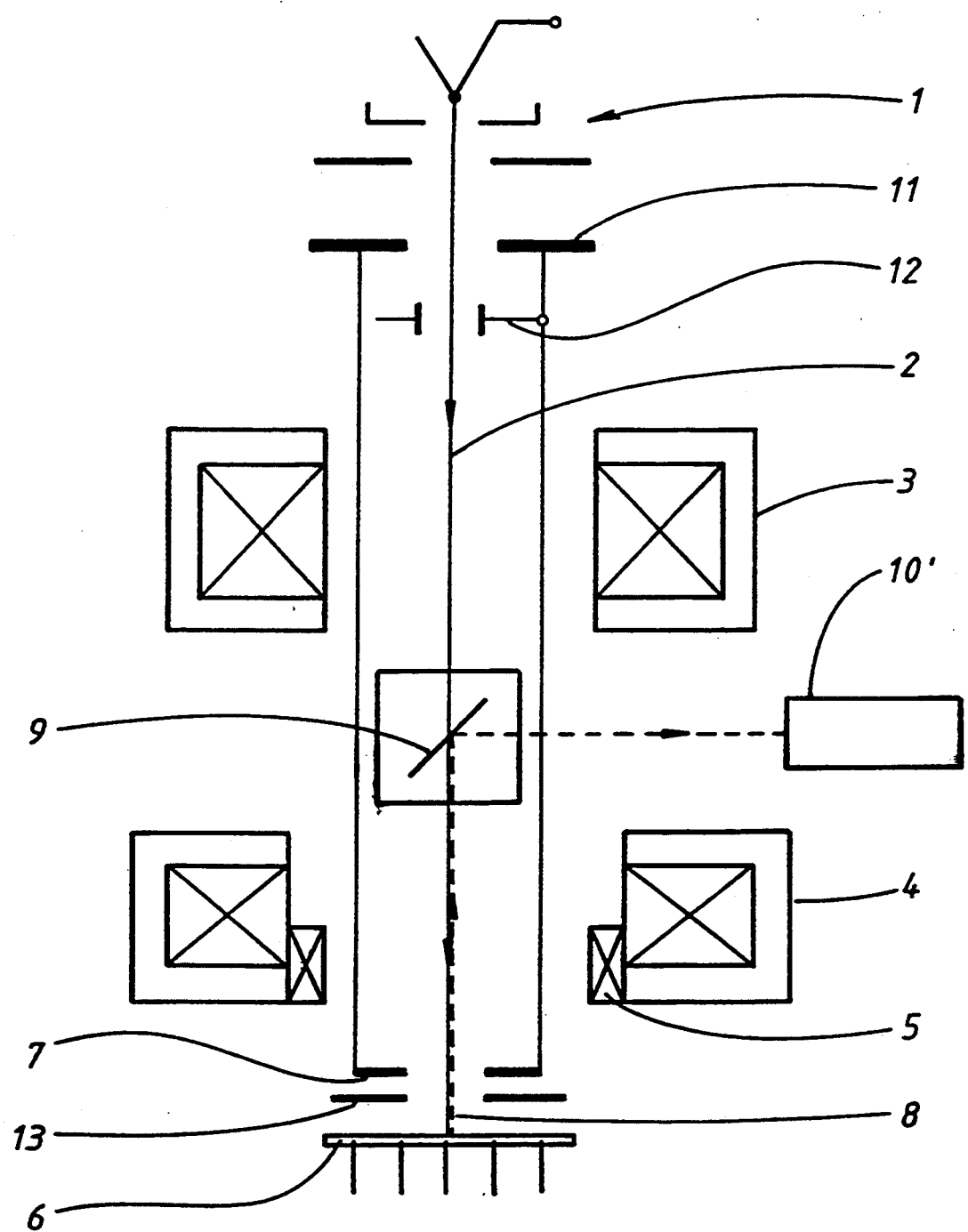
FIG. 3 shows a variant of the electron beam tester illustrated in FIG. 2.

In the variant of the electron beam tester according to FIG. 2 which is shown in FIG. 3 an additional extractor electrode 13 is provided in order to achieve a variable field strength at the location of the specimen.

Naturally, within the scope of the invention variants of the scanning electron beam devices illustrated with the aid of FIGS. 1 to 3 are possible. For instance the scanning electron microscope according to FIG. 1 can be constructed with intermediate acceleration of the primary electron beam. The electron beam testers of FIGS. 2 and 3 can also be constructed—according to the principle of FIG. 1—without intermediate acceleration.

Various possibilities for the reflection of the secondary electron beam are explained with the aid of FIGS. 4 to 15.

Figure 4:
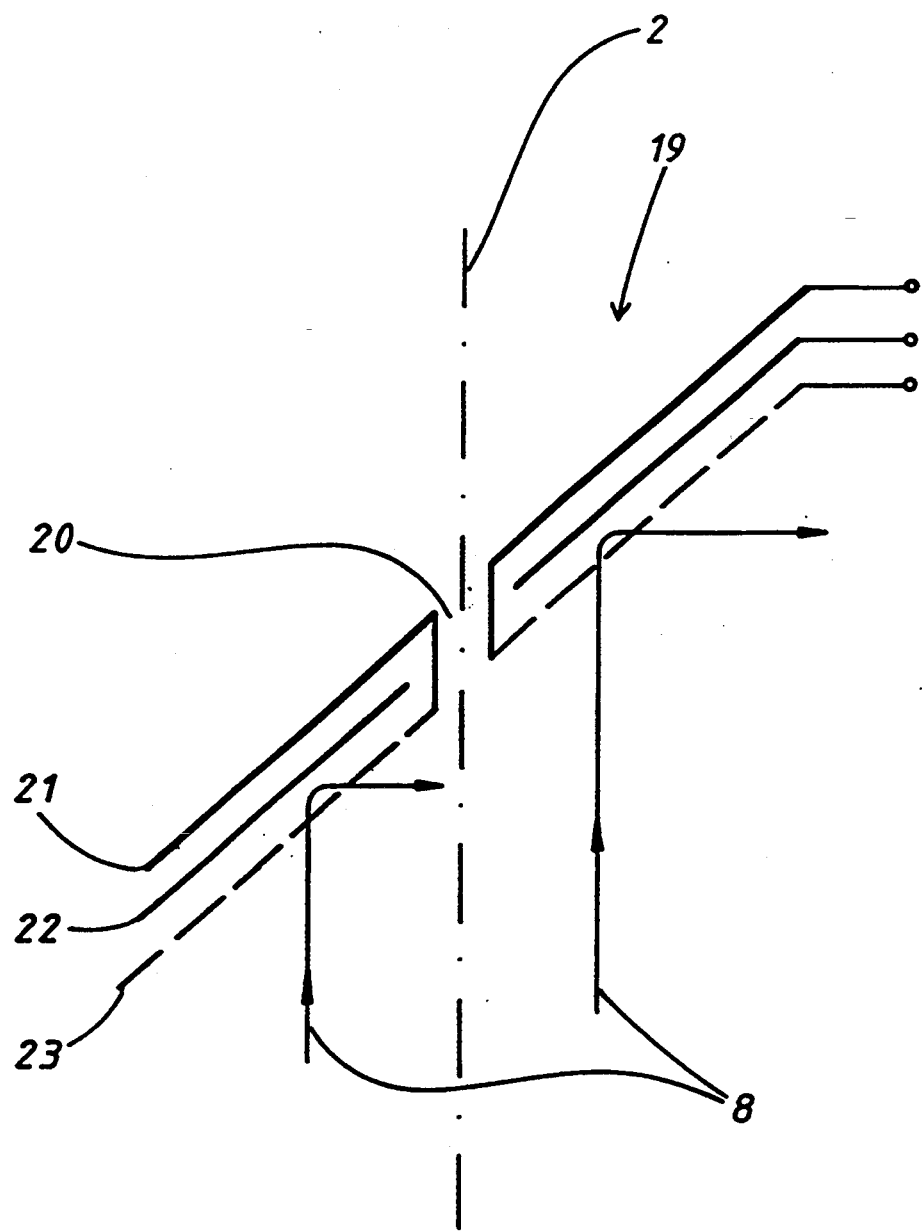

FIG. 4 shows an electrostatic reflector 19 which is arranged in the beam path of the primary electron beam 2 and provided with an aperture 20 for the primary electron beam to pass through.

The reflector 19 contains a screening electrode 21, a reflector electrode 22 and a closure grid 23.

The closure grid 23 is at the potential of the extraction electrode 7 (FIGS. 1, 2 and 3). Its purpose is to bring the accelerated secondary electrons with the energy corresponding to the extraction voltage to the reflector. Furthermore, the closure grid 23 screens off the voltage applied to the reflector electrode 22. The screening electrode 21 has the same purpose on the rear face of the reflector.

The voltage of the reflector electrode 22 is generally more negative than the corresponding energy of the secondary electrons, so that the secondary electrons are retarded in order then to leave the reflector again, accelerated again by the closure grid 23.

The secondary electron beam 8 leaves the reflector 19 at double the angle of inclination of the reflector. In the arrangement according to FIG. 4 the angle of inclination is 45°, and thus the reflector angle is 90°.

Thus the secondary electrons are initially retarded by means of the electrostatic reflector 19, then reflected on a negative equipotential surface and then accelerated again, so that they leave the arrangement with high energy.

Towards the exterior this arrangement appears as a flat reflector. However, reflectors with other shapes can be also be used so long as this is useful for the subsequent detection. Spherical reflectors, parabolic reflectors or the like can be used, for example.

In the embodiment according to FIG. 4, in which the reflector is arranged in the beam path of the primary electron beam and no preliminary deflection is provided for the secondary electron beam, the reflector 19 must be provided with the aforementioned aperture 20 for the primary electron beam. However, this aperture can be kept very small.

With the aid of FIGS. 5 to 15 embodiments are explained below in which the reflector is arranged outside the beam path of the primary electron beam and an electron-optical element is provided between the object and the reflector which effects a preliminary deflection of the secondary electron beam by a small angle with respect to the beam path of the primary electron beam.

Figure 5:
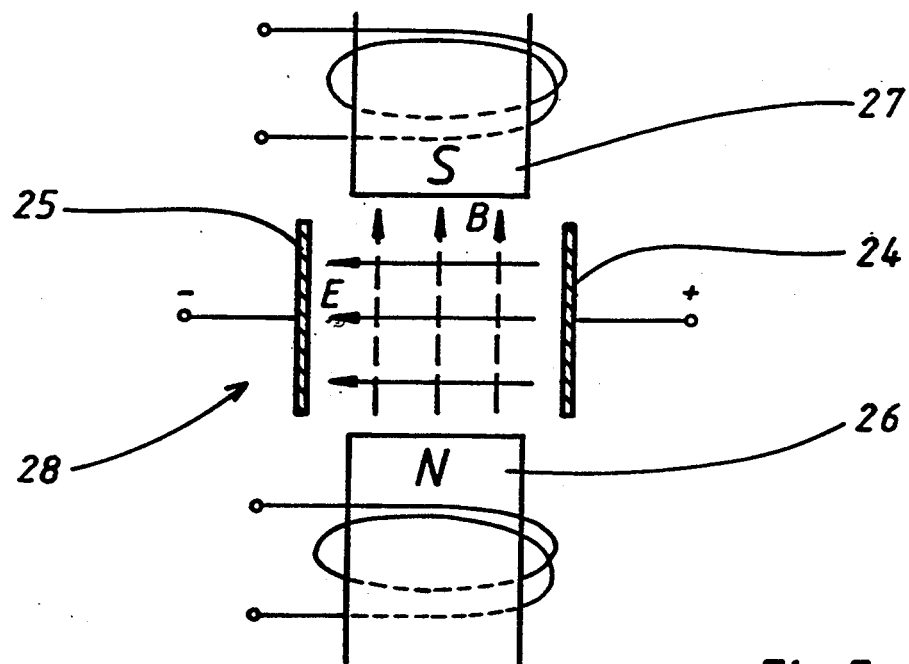
FIGS. 5 and 6 shows a plan view and a side view of a one-stage Wien filter.
Figure 6:
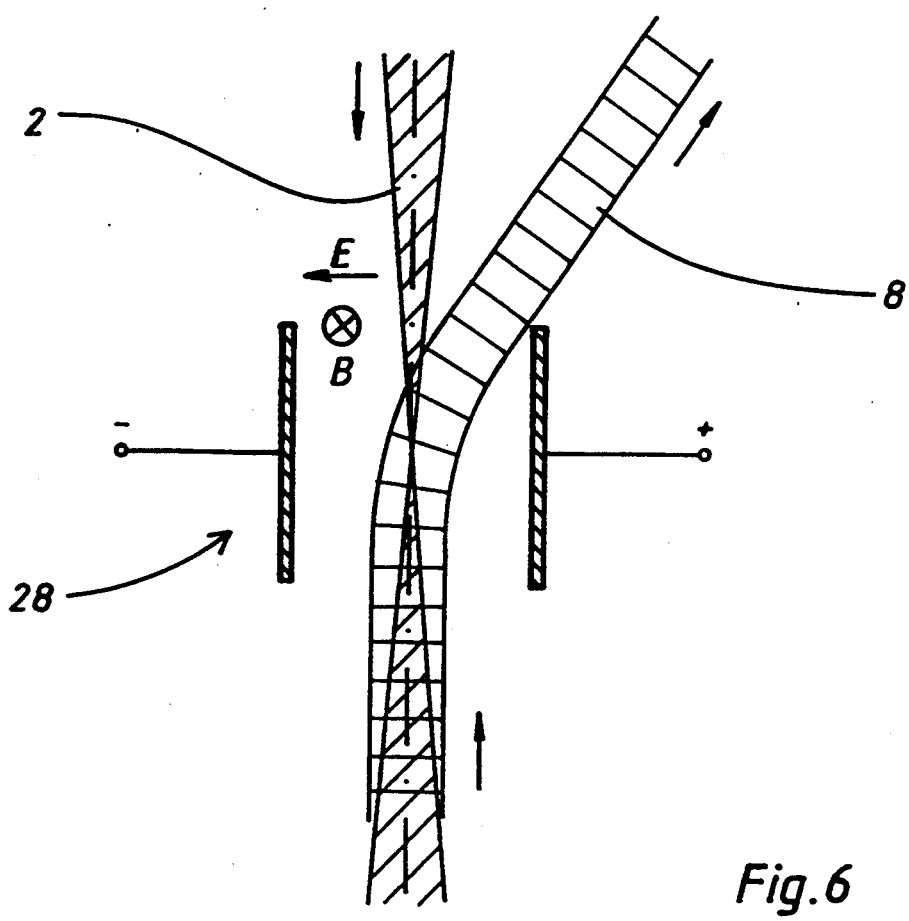

A one-stage Wien filter 28 is illustrated schematically in plan view and in side view in FIGS. 5 and 6. It contains an electric field (lines of force E) produced by two electrodes 24, 25 as well as a magnetic field (lines of flux B) produced by an electromagnetic system. The electric and magnetic fields run at right angles to one another and also at right angles to the axis of the primary electron beam 2. The electric and magnetic fields should advantageously have the same field shape.

As the side view of the Wien filter illustrated in FIG. 6 shows, the primary electron beam 2 has a beam crossover in the center of the Wien filter or in the immediate proximity thereof. In this way the aberration effects produced in the first field-half of the Wien filter are substantially compensated by the effects of the second field-half. By suitable polarity of the electric and magnetic fields the effects of the electric and magnetic fields for the primary electron beam 2 mutually cancel one another, so that the primary electron beam 2 passes through the Wien filter without deflection. On the other hand, the secondary electron beam 8 running in the opposite direction is deflected by the combined effects of the electric and magnetic fields in the manner shown in FIG. 6.

Figure 7:
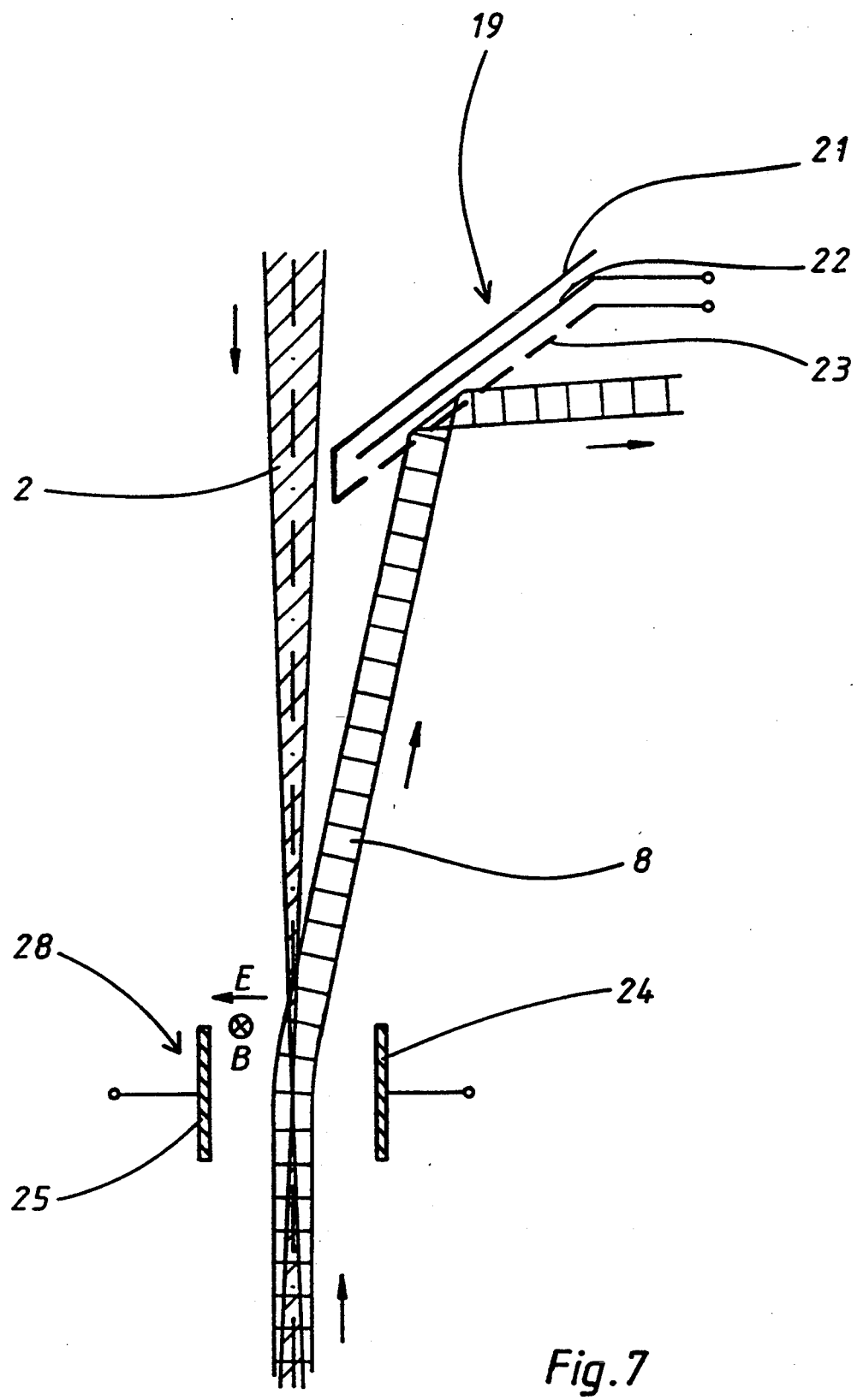
FIG. 7 shows a combination of one-stage Wien filter with an electrostatic reflector.

FIG. 7 shows the combination of a Wien filter 28 according to FIGS. 5 and 6) with an electrostatic reflector 19 (according to FIG. 4). Due to the Wien filter 28 the secondary electron beam 8 undergoes a preliminary deflection by a small angle with respect to the beam path of the primary electron beam 2. The electrostatic reflector 19 arranged outside the beam path of the primary electron beam 2 then effects a strong reflection of the secondary electron beam 8.

Figure 8:
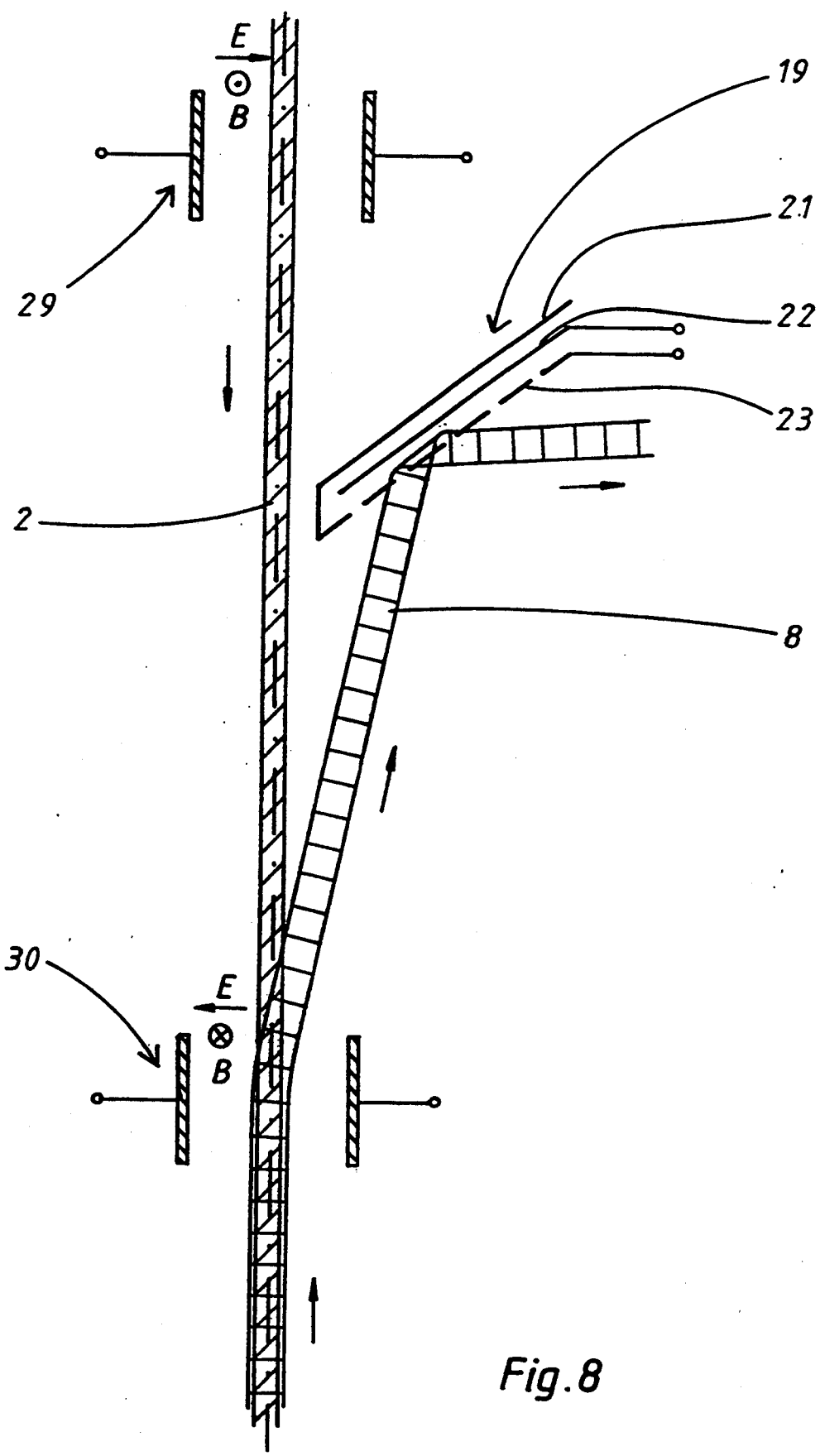
FIG. 8 shows a combination of a two-stage Wien filter with an electrostatic reflector.

FIG. 8 shows an arrangement with a two-stage Wien filter, consisting of the stages 29 and 30, and an electrostatic reflector 19. The two stages 29, 30 of this Wien filter have the reverse polarities of the electric and magnetic fields and the primary electron beam 2 passes through them in succession, whilst the secondary electron beam 8 only passes through the second stage 30 of the Wien filter which is arranged between the object (not shown) and the reflector 19. Thus this second stage 30 of the Wien filter forms the electron-optical element for preliminary deflection of the secondary electron beam 8 by a small angle with respect to the beam path of the primary electron beam 2. Just as in the embodiment explained above, in the variant according to FIG. 8 also the primary electron beam 2 is not deflected by the Wien filter but merely spread (dispersed), with opposing and mutually compensating spreading occurring in the two stages 29 and 30.

Figure 9:
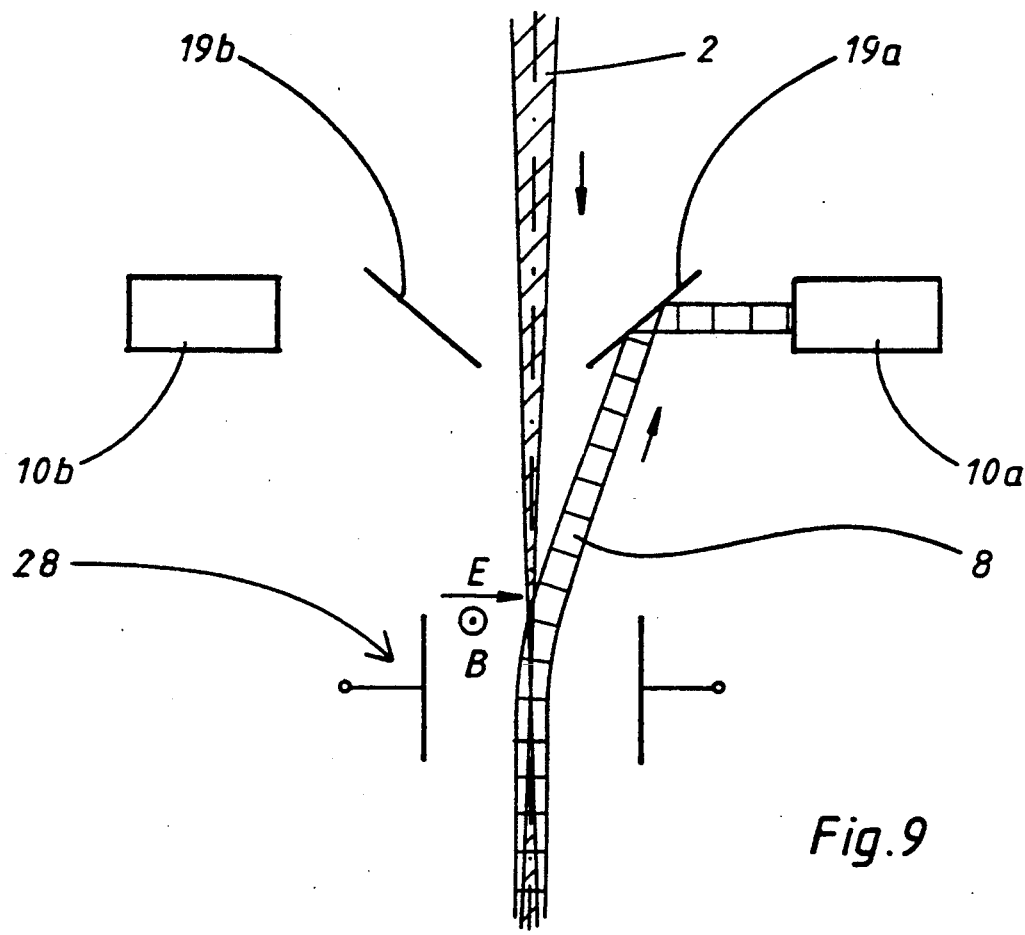
FIGS. 9 and 10 show a variant of the arrangement according to FIG. 7.
Figure 10:
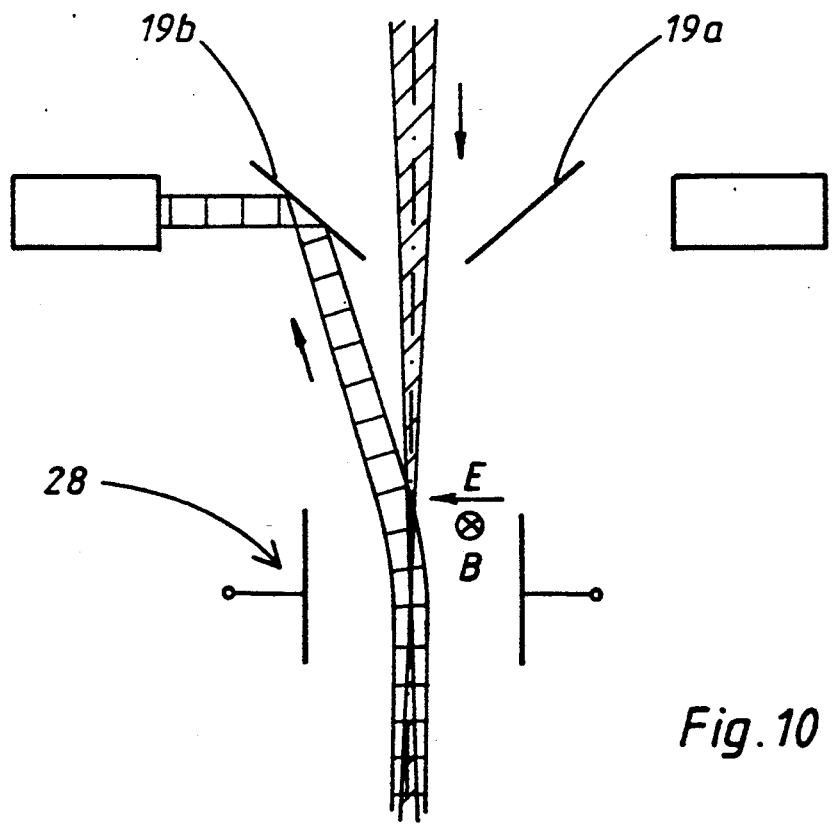

FIGS. 9 and 10 show the part of a scanning electron beam device (electron beam tester or scanning electron microscope) which is essential for the invention, comprising a one-stage Wien filter 28, two electrostatic reflectors 19a, 19b and two arrangements 10a, 10b (formed by detectors or spectrometers) for detecting the reflected secondary electron beam 8. The two reflectors 19a, 19b are arranged outside the beam path of the primary electron beam 2 on opposite sides of this beam. The Wien filter 28 is arranged between the object (not shown) and the reflectors 19a, 19b, and the polarity of its electric and magnetic fields can be switched over so that the secondary electron beam 8 can be delivered as required (cf. FIGS. 9 and 10) by one of the two 19a, 19b to one or the other of the detecting arrangements 10a, 10b respectively.

Figure 11:
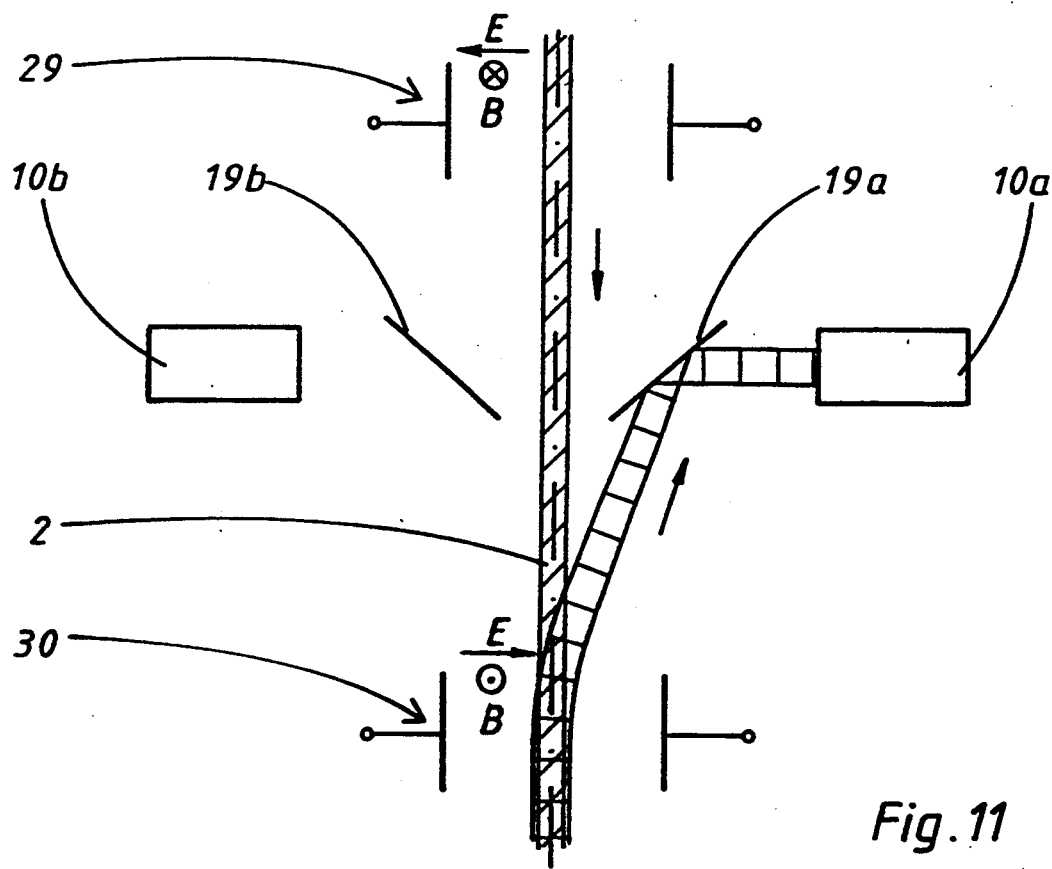
FIGS. 11 and 12 show a variant of the arrangement according to FIG. 8.
Figure 12:
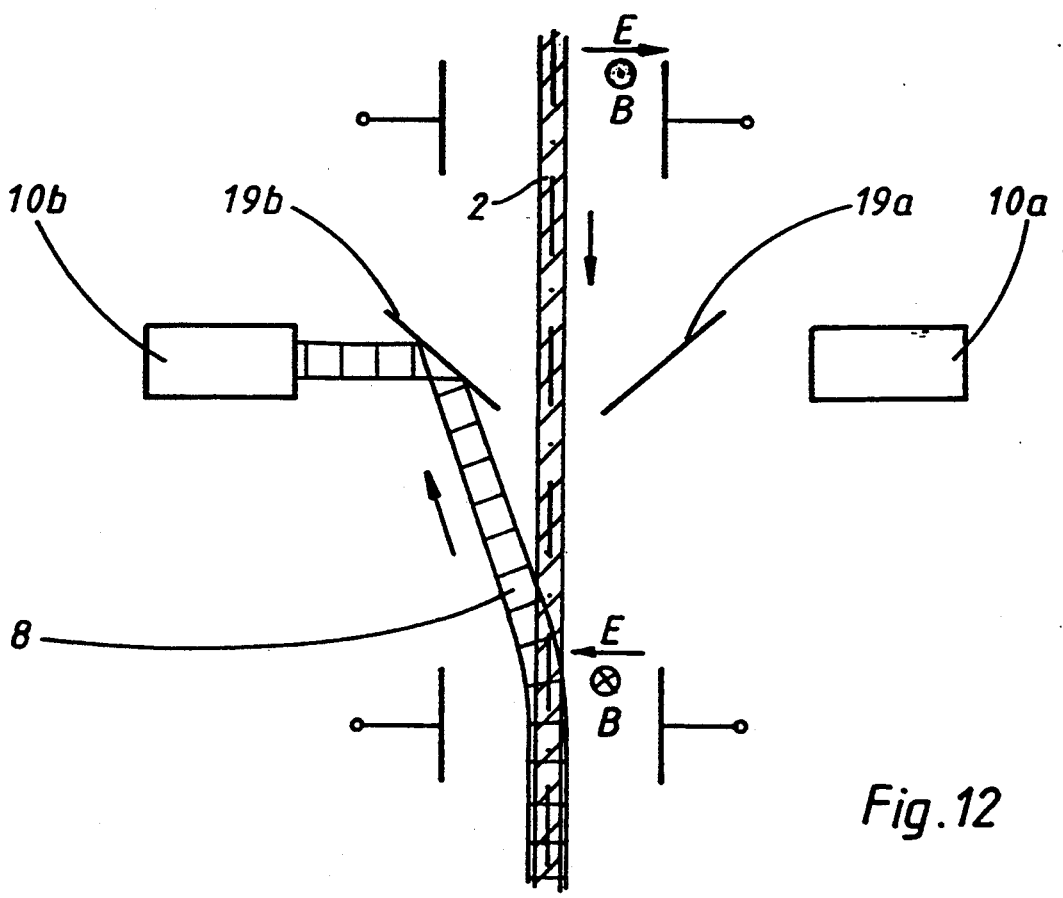

FIGS. 11 and 12 show a variant of the construction according to FIGS. 9 and 10. Instead of a one-stage Wien filter 28, in the arrangement according to FIGS. 11 and 12 a Wien filter is provided which consists of two stages 29 and 30, the reflectors 19a, 19b being arranged between these two stages. By switching over of the electric and magnetic polarity of the two stages 29, 30 of this Wien filter, the secondary electron beam 8 can be delivered to one or other of the detecting arrangements 10, 10b.

Figure 13:
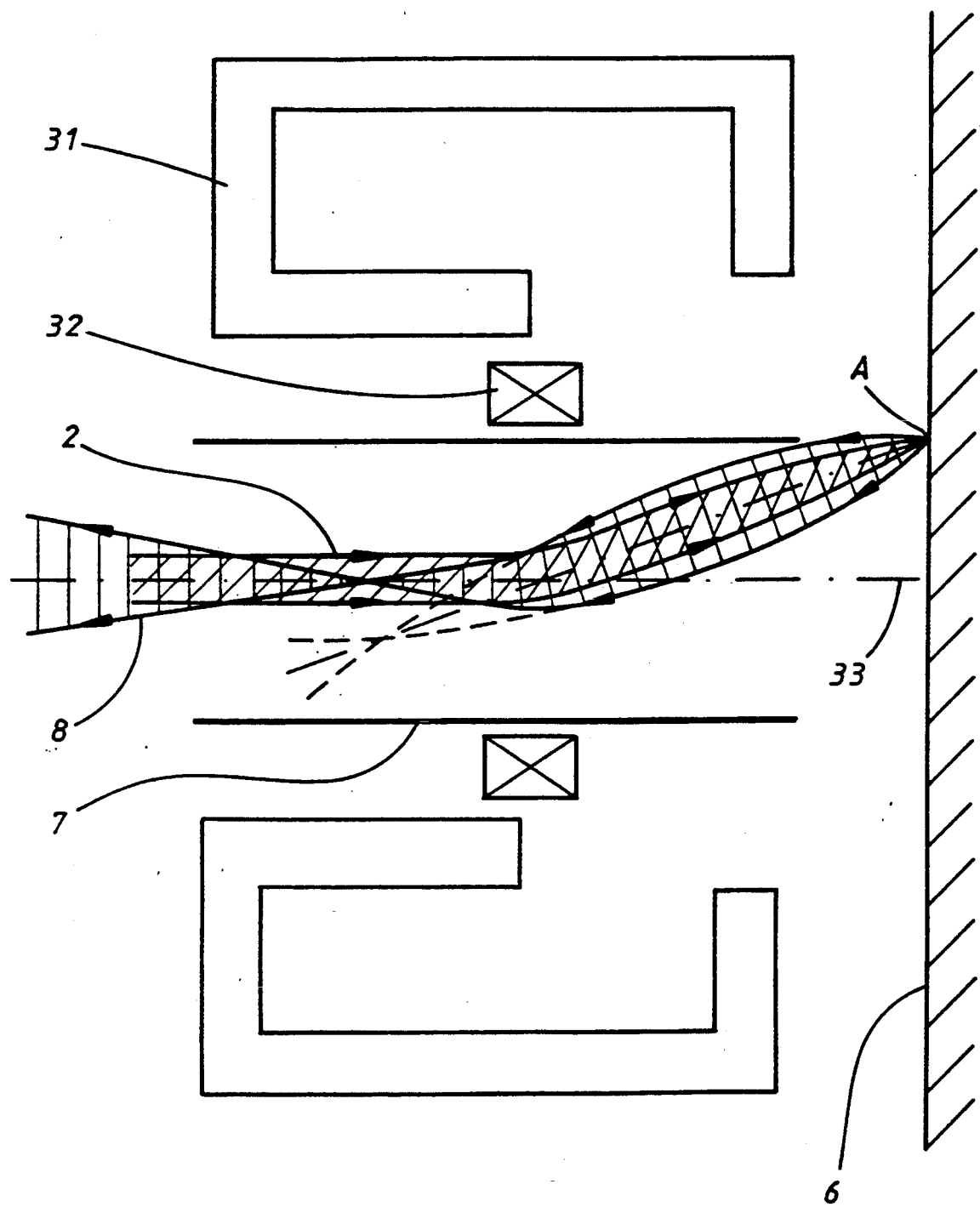
FIGS. 13, 14 and 15 show a side view and two plan views of a further embodiment.
Figure 14:
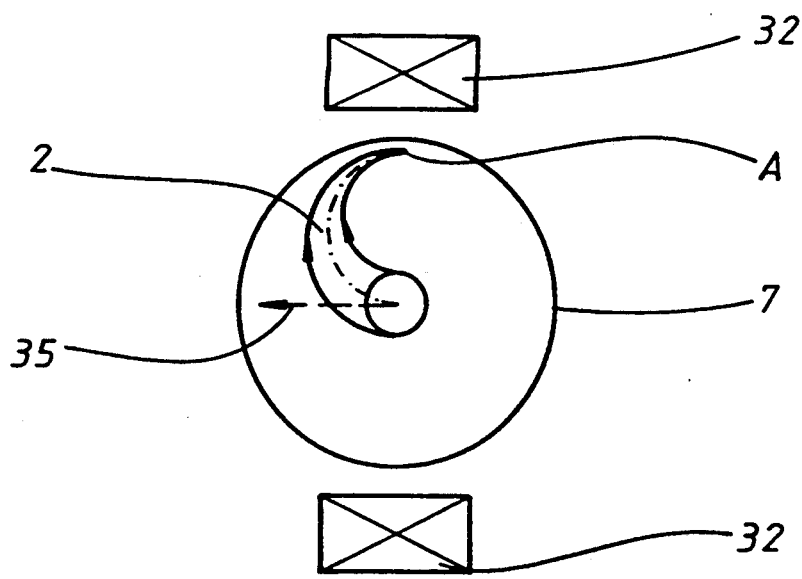
Figure 15:
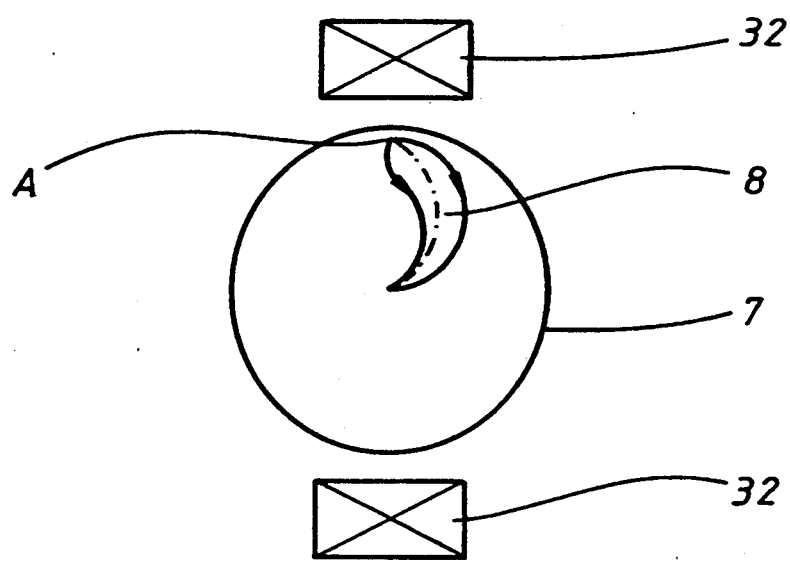

Finally, FIGS. 13 to 15 show a preferred embodiment in which during scanning of the primary electron beam 2 the secondary electron beam 8 is not or only slightly deflected, which is achieved by suitable arrangement and dimensioning of the objective lens 31 which serves for focussing of the primary electron beam 2 and of the deflection system 32 which serves for raster deflection of the primary electron beam 2.

FIG. 13 shows the region before the object 6. The axis of symmetry is designated by 33. The primary electron beam 2 comes first of all under the influence of the deflection system 32 and then under the effect of the objective lens 31. This exploits the fact that during focussing of the primary electron beam 2 the magnetic objective lens 31 simultaneously exerts a rotation on the electron beam. The detailed operation is as follows:

The primary electron beam 2 is deflected by the deflection system 32 (towards the left, cf. arrow 35, in the representation according to FIG. 14). When it then passes through the lens field of the objective lens 31 (or a part thereof) it is rotated thereby (clockwise in the view of FIG. 14). Thus the primary electron beam 2 describes a helical path.

The objective lens 31 and the deflection system 32 are arranged and dimensioned in such a way that during focussing of the primary electron beam 2 on the surface of the object 6 the rotation (with respect to the direction of deflection indicated by the arrow 35) is just 90°. Thus the primary electron beam 2 strikes the object 6 at point A.

The secondary electrons emitted there are drawn off by the extraction electrode 7 and accelerated to a high energy. Therefore the secondary electron beam 8 has a similar energy and a similar behaviour to the primary electron beam 2. When the secondary electron beam 8 passes through the magnetic field of the objective lens 31 it is also rotated by almost 90° on a helical path in the same direction of rotation (cf. FIG. 15) and thus reaches the deflection system 32 at an angle which just corresponds to the negative angle of deflection of the primary electron beam 2.

When passing through the deflection system 32 the secondary electron beam 8 is deflected by an angle which again just compensates its angle of incidence. Thus the secondary electron beam 8 leaves the deflection system 32 to the greatest possible extent axially. This means that—irrespective of the raster deflection of the primary electron beam 2—the secondary electron beam 8 always enters almost axially into the subsequent arrangement according to the invention for deflection of the secondary electron beam 8.

We claim:

1. Scanning electron beam device, particularly an electron beam tester or a scanning electron microscope comprising:
   a) an electron source for producing a primary electron beam,
   b) means for influencing the primary electron beam between the electron source and an object,
   c) means for reflecting a secondary electron beam emitted by irradiating the primary electron beam on the object,
   d) means for detecting the reflected secondary electron beam,
   characterized in that:
   e) the means for reflecting the secondary electron beam comprises an electrostatic reflector (9,19) which is arranged in such a way that said reflector reflects at least a substantial part of the secondary electron beam (8).

2. Scanning electron beam device as claimed in claim 1, characterised in that the reflector (19) is arranged outside a beam path of the primary electron beam (2), and between the object (6) and the reflector (19) at least one electron-optical element is provided which effects a preliminary deflection of the secondary electron beam by a small angle with respect to the beam path of the primary electron beam.

3. Scanning electron beam device as claimed in claim 2, characterised in that the electron-optical element which effects the preliminary deflection of the secondary electron beam (8) is formed by a one-stage Wien filter (28) and a beam crossover of the primary electron beam (2) lying at least approximately in the center of this Wien filter.

4. Scanning electron beam device as claimed in claim 2, characterised in that the electron-optical element which effects the preliminary deflection of the secondary electron beam is formed by one stage (30) of a two-stage Wien filter (29, 30), wherein the two stages of this Wien filter have reverse polarities and the primary electron beam (2) passes through said two-stages in succession, whilst the secondary electron beam (8) only passes through the stage (30) of the two-stage Wien filter which is arranged between the object (6) and the reflector (19).

5. Scanning electron beam device as claimed in claim 2, further characterised by the following features:
f) a second electrostatic reflector arranged outside the beam path of the primary electron beam,
g) said reflectors and electron-optical element being arranged such that the secondary electron beam strikes said first-mentioned reflector when said electron-optical element has a first magnetic field polarity and a first electric field polarity and strikes said second reflector when said electron-optical element has magnetic and electric field polarities that are opposite said first magnetic and electric field polarities, respectively, and h) said means for detecting comprises first means for detecting the secondary electron beam when it is reflected from said first-mentioned reflector and second means for detecting the secondary electron beam when it is reflected from said second reflector.

6. Scanning electron beam device as claimed in claim 1, further comprising:
f) a deflection system (32) for deflecting the primary electron beam (2),
g) and an objective lens (31) for focussing the primary electron beam onto the object (6),
characterized in that:
h) the deflection system (32) is arranged in front of the objective lens (31) when viewed in the direction of movement of the primary electron beam (2), and the objective lens and deflection system are dimensioned and arranged such that when the deflected primary electron beam is focussed by the objective lens it is simultaneously rotated by about 90° with respect to the direction of deflection (arrow 35) so that the secondary electron beam (8), which is equally rotated by about 90° in the same direction of rotation, reaches the deflection system (32) at an angle which corresponds to a negative angle of deflection of the primary electron beam (2).

7. Electron beam device as claimed in claim 1, characterized in that said reflector (19) is arranged in a beam path of the primary electron beam (2) and is provided with an aperture (20) for the primary electron beam to pass through.

* * * * *